(12) United States Patent
Asano et al.

(10) Patent No.: US 11,172,146 B2
(45) Date of Patent: Nov. 9, 2021

(54) IMAGING APPARATUS AND SOLID-STATE IMAGING DEVICE USED THEREIN

(71) Applicant: PANASONIC INTELLECTUAL PROPERTY MANAGEMENT CO., LTD., Osaka (JP)

(72) Inventors: Takuya Asano, Hyogo (JP); Takuya Nohara, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 1 day.

(21) Appl. No.: 16/591,111

(22) Filed: Oct. 2, 2019

(65) Prior Publication Data

US 2020/0036913 A1    Jan. 30, 2020

Related U.S. Application Data

(63) Continuation of application No. PCT/JP2018/014065, filed on Apr. 2, 2018.
(Continued)

(51) Int. Cl.
*H04N 5/33* (2006.01)
*H01L 27/146* (2006.01)
(Continued)

(52) U.S. Cl.
CPC .......... *H04N 5/33* (2013.01); *G01C 3/08* (2013.01); *G02B 3/0037* (2013.01); *H01L 27/14623* (2013.01)

(58) Field of Classification Search
CPC .......... H04N 5/33; H04N 5/335; H04N 5/332; G01C 3/08; G02B 3/0037; H01L 27/14623

See application file for complete search history.

(56) References Cited

U.S. PATENT DOCUMENTS

2008/0122933 A1* 5/2008 Murayama ............. H04N 5/332
  348/164
2012/0249852 A1* 10/2012 Fukuda ............. H01L 27/14623
  348/311
(Continued)

FOREIGN PATENT DOCUMENTS

JP        2001-196568 A      7/2001

OTHER PUBLICATIONS

International Search Report and Written Opinion dated Jun. 19, 2018 in International Application No. PCT/JP2018/014065; with partial English translation.

*Primary Examiner* — Rowina J Cattungal
(74) *Attorney, Agent, or Firm* — McDermott Will and Emery LLP

(57) ABSTRACT

An imaging apparatus includes: an infrared light source; and a solid-state imaging device. The solid-state imaging device includes: light receivers that convert incident light from the subject to signal charges; a signal storage that stores the signal charges; a signal drain into which the signal charges are discharged; microlenses disposed on the light receivers; and openings through which the incident light enters the light receivers. The solid-state imaging device reads and discharges the signal charges in response to a signal drain voltage being switched between on and off. Each microlens is disposed such that the center of the microlens is displaced toward the center of the pixel array from the center of the corresponding light receiver, as the position of the microlens is closer to the perimeter of the pixel array. The openings have different shapes according to the positions of the openings in the pixel array.

18 Claims, 16 Drawing Sheets

Related U.S. Application Data

(60) Provisional application No. 62/482,385, filed on Apr. 6, 2017.

(51) Int. Cl.
*G01C 3/08* (2006.01)
*G02B 3/00* (2006.01)

(56) References Cited

U.S. PATENT DOCUMENTS

| | | | |
|---|---|---|---|
| 2013/0182156 A1* | 7/2013 | Moriya | H01L 27/14607 |
| | | | 348/294 |
| 2014/0111681 A1* | 4/2014 | Fukuda | H01L 27/14623 |
| | | | 348/340 |
| 2016/0073088 A1* | 3/2016 | Cohen | H01L 27/14812 |
| | | | 348/46 |
| 2016/0218127 A1* | 7/2016 | Kato | H01L 27/14643 |
| 2017/0150063 A1* | 5/2017 | Sano | H04N 5/232122 |
| 2017/0187972 A1* | 6/2017 | Murao | H04N 5/37457 |
| 2018/0166488 A1* | 6/2018 | Sugizaki | H01L 27/14634 |

* cited by examiner

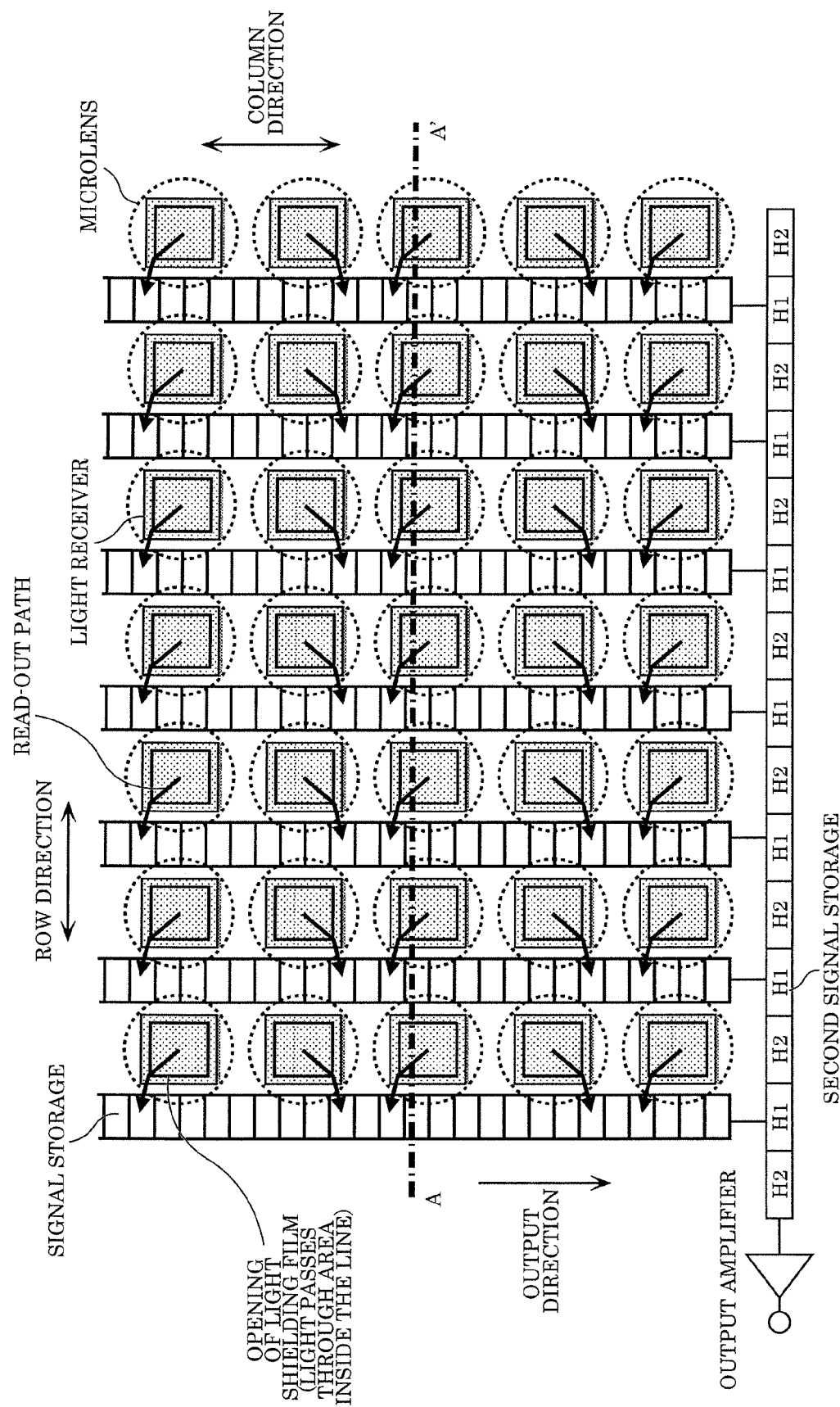

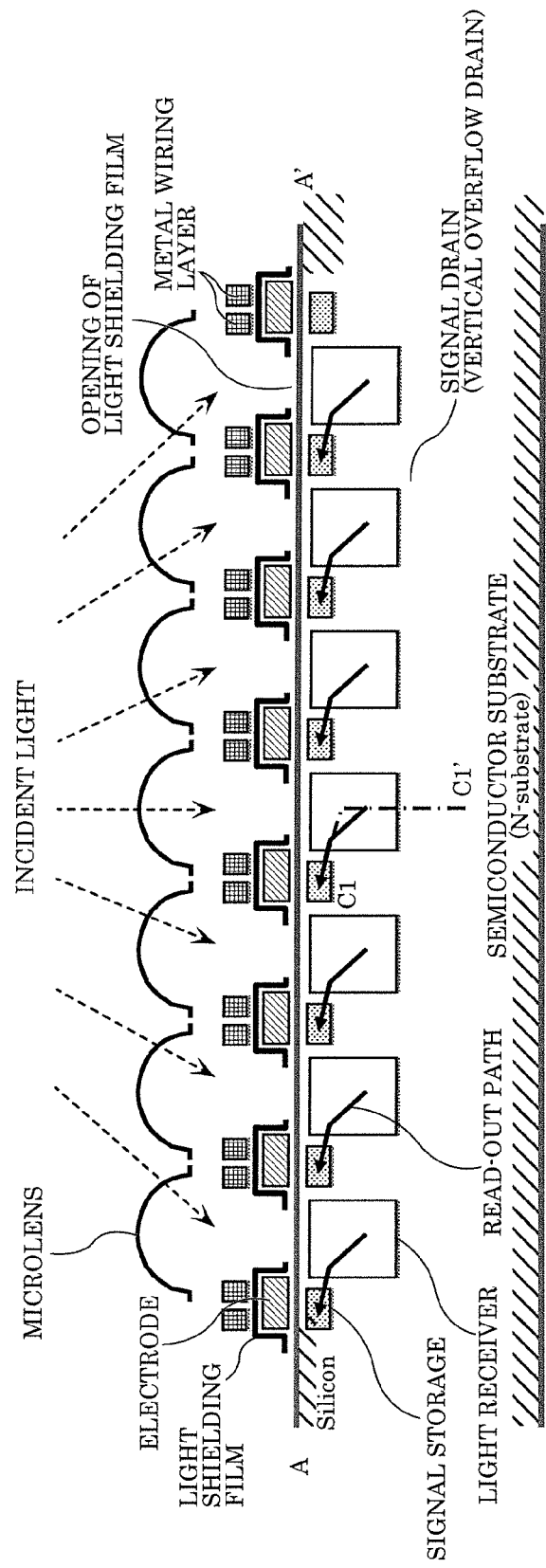

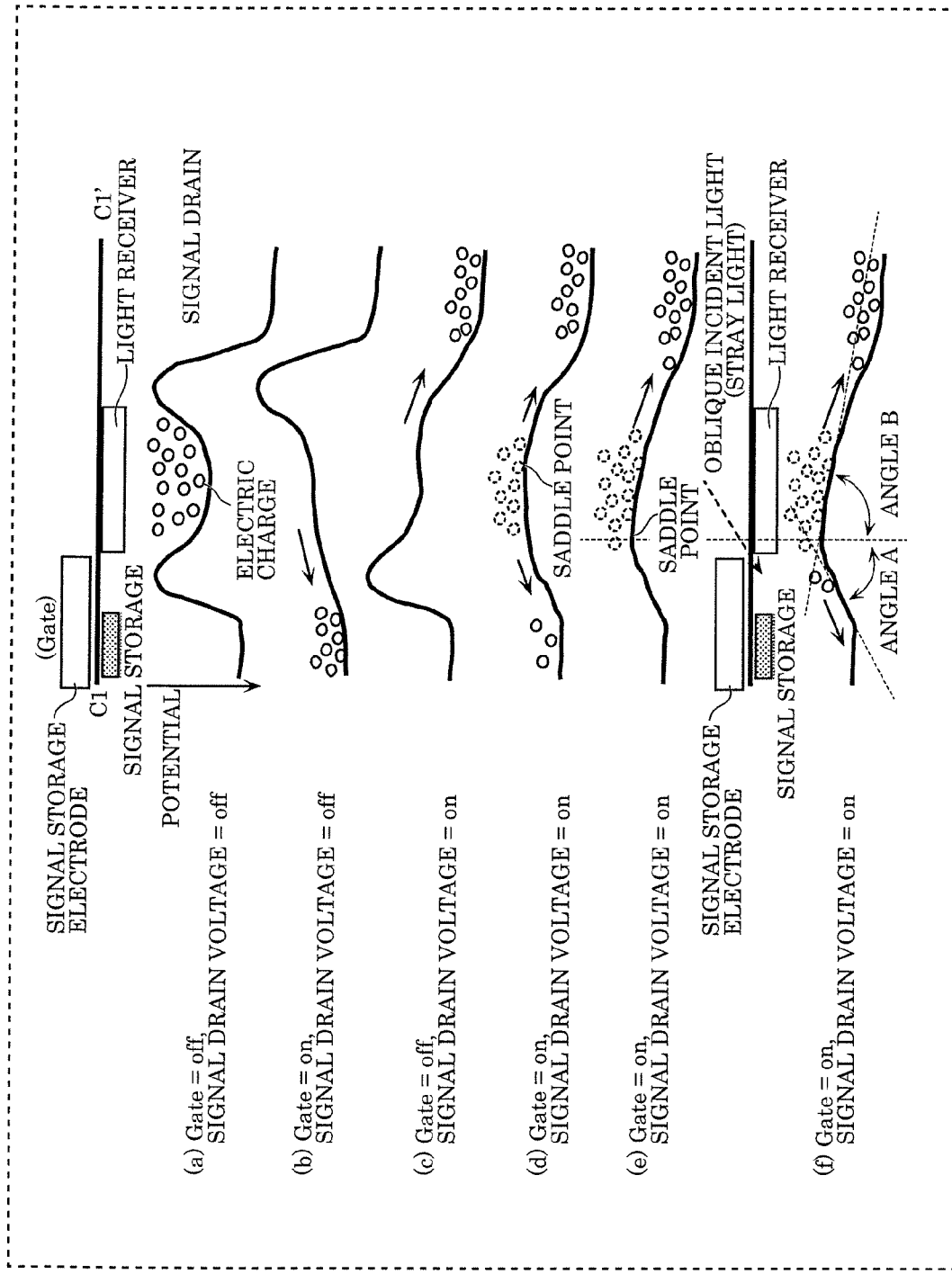

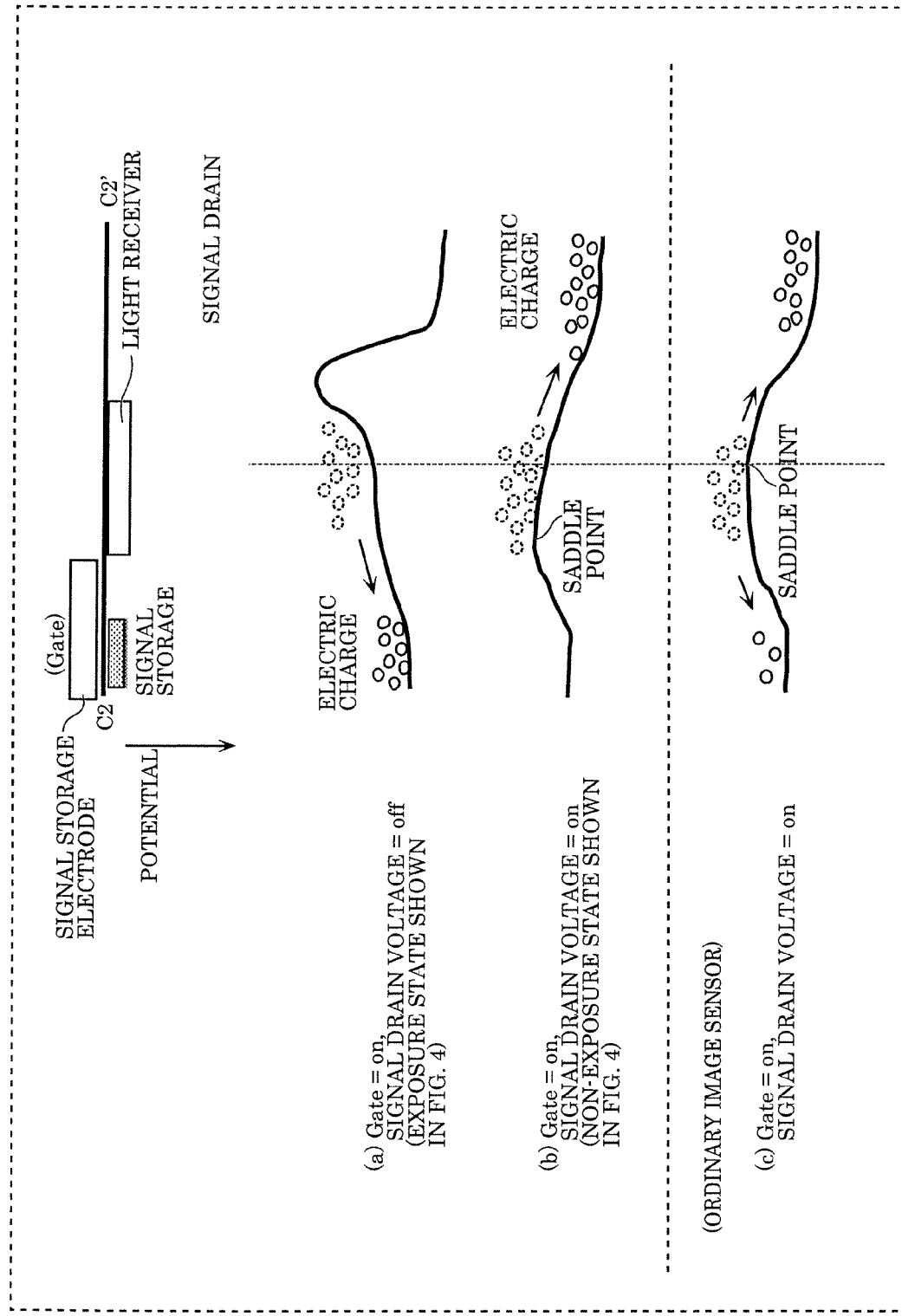

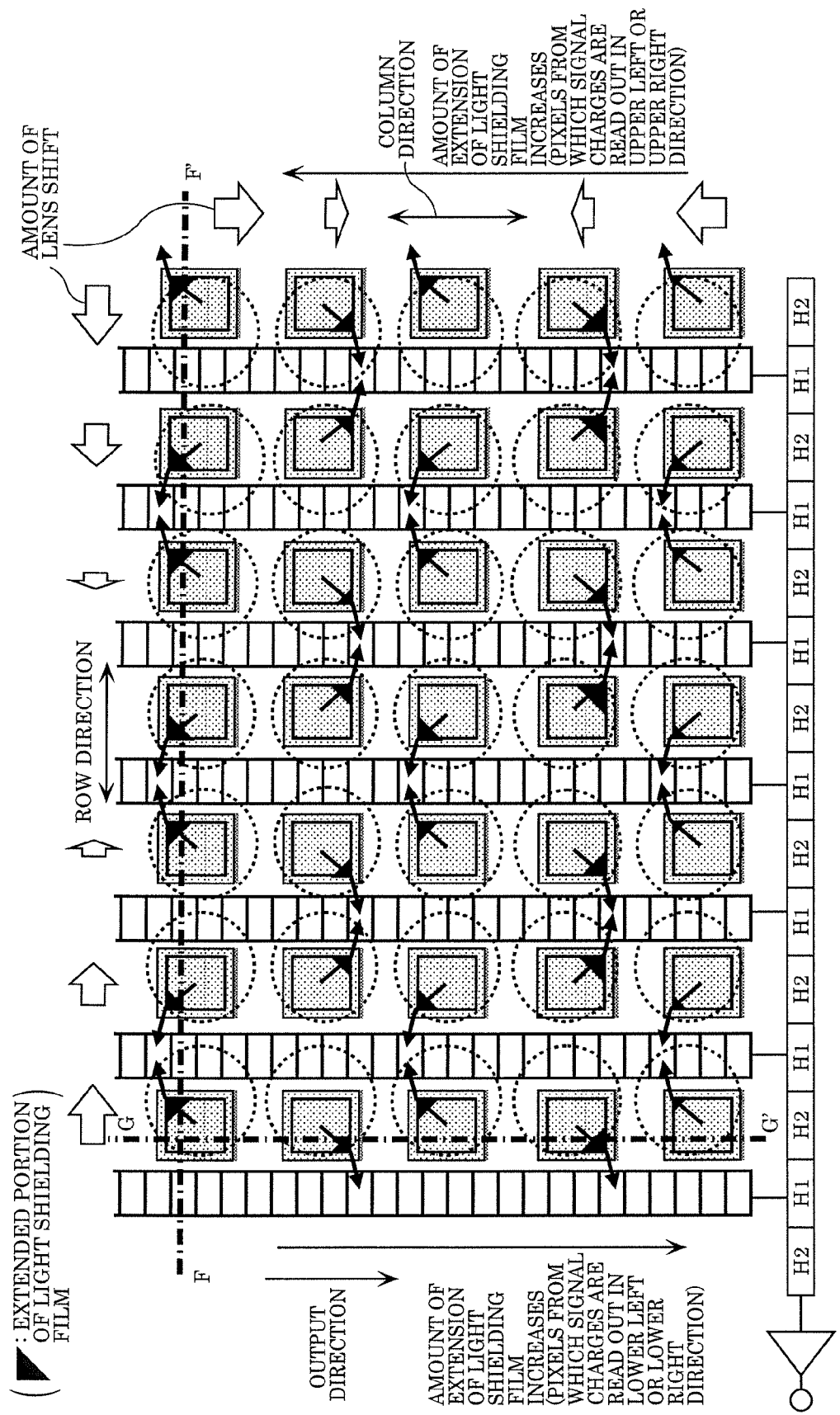

IMAGING APPARATUS AND SOLID-STATE IMAGING DEVICE USED THEREIN

CROSS REFERENCE TO RELATED APPLICATIONS

This application is a U.S. continuation application of PCT International Patent Application Number PCT/JP2018/014065 filed on Apr. 2, 2018, claiming the benefit of priority of U.S. Provisional Patent Application No. 62/482,385 filed on Apr. 6, 2017, the entire contents of which are hereby incorporated by reference.

BACKGROUND

1. Technical Field

The present disclosure relates to an imaging apparatus, and a solid-state imaging device used therein.

2. Description of the Related Art

Camera modules that are equipped in smartphones and the like are required to be thin, and in order to achieve a thin camera module, an optical lens that is provided in front of a solid-state imaging device is also required to be thin.

In order to solve this problem, Japanese Unexamined Patent Application Publication No. 2001-196568 discloses a technique in which microlenses provided on pixels are displaced (shrunk) relative to the pixels.

In recent years, smartphones, game consoles, and the like are equipped with, for example, a rangefinder camera that emits infrared light to a photographing space to detect movements of the body and hands of a subject (human) and determine the shape of the subject. Time Of Flight (TOF) principle is known as one of the operation principles for detecting the distance to a subject by using a rangefinder camera. A rangefinder camera that uses the TOF principle, for example, emits infrared light in a pulsed manner and receives reflected light reflected by the subject during two different exposure periods. As a result, two signal charges A0 and A1 are generated, and the distance to the subject is obtained from the ratio of signal charges A0 and A1.

Range finder cameras are also required to detect a subject in a wide area, and thus the use of a wide angle lens is required.

However, if the conventional technique disclosed in the conventional technique, in which microlenses provided on pixels are displaced (shrunk) relative to the pixels, is applied to a rangefinder camera so as to achieve a thin optical lens and to use a wide angle lens, a problem arises in that a portion of incident light does not travel toward the light receivers, which increases the amount of unintended signal charges being mixed and creates a noise component to reduce the accuracy of distance measurement.

SUMMARY

The present disclosure has been made in order to solve the problem described above. It is an object of the present disclosure to provide an imaging apparatus and a solid-state imaging device that improve the accuracy of distance measurement.

An imaging apparatus according to one aspect of the present disclosure is an imaging apparatus including: an infrared light source that emits infrared light to a subject; and a solid-state imaging device that includes a pixel array in which a plurality of pixels are arranged in rows and columns, wherein the solid-state imaging device includes: a plurality of light receivers that convert incident light from the subject to signal charges, and are arranged in rows and columns correspondingly to the plurality of pixels; a signal storage that stores the signal charges; a signal drain into which the signal charges are discharged; a plurality of microlenses that are disposed on the plurality of light receivers in one-to-one correspondence with the plurality of light receivers; and a plurality of openings that are provided in one-to-one correspondence with the plurality of light receivers, and through which the incident light enters the plurality of light receivers, the solid-state imaging device reads and discharges the signal charges in response to a signal drain voltage being switched between on and off, each of the plurality of microlenses is disposed such that a center of the microlens is displaced toward a center of the pixel array from a center of one of the plurality of light receivers that corresponds to the microlens, as a position of the microlens is closer to a perimeter of the pixel array, and the plurality of openings have different shapes according to positions of the plurality of openings in the pixel array.

The signal drain voltage may be a substrate voltage, which is represented by φSub, and the signal drain may be a vertical overflow drain.

Alternatively, the signal drain may be a lateral overflow drain.

Also, a read-out voltage may be on while the solid-state imaging device reads and discharges the signal charges.

Also, each of the plurality of openings may have a shape that blocks, incident light, which is oblique light, in a read-out path.

Also, a configuration is possible in which the pixel array has a configuration in which the plurality of light receivers and a plurality of the signal storages into which the signal charges of the plurality of light receivers are read out are disposed alternately in a row direction or a column direction, the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to a corresponding one of the plurality of the signal storages in a second oblique direction that is different from the first oblique direction, some of the plurality of openings that are provided in one-to-one correspondence with the plurality of first pixels have a shape that blocks more incident light, which is oblique light, in a read-out path as some of the plurality of openings are located toward a direction opposite to an output direction of the signal charges from the pixel array, and some of the plurality of openings that are provided in one-to-one correspondence with the plurality of second pixels have a shape that blocks more incident light, which is oblique light, in a read-out path as some of the plurality of openings are located toward a forward direction of the output direction.

Also, a configuration is possible in which the pixel array has a configuration in which the plurality of light receivers and a plurality of the signal storages into which the signal charges of the plurality of light receivers are read out are disposed alternately in a row direction, and the plurality of openings have a shape that blocks more incident light, which is oblique light, in a read-out path as the plurality of openings are located toward a read-out direction of the signal charges from the plurality of pixels into the plurality of the signal storages.

Also, a configuration is possible in which the pixel array has a configuration in which the plurality of light receivers and a plurality of the signal storages into which the signal charges of the plurality of light receivers are read out are disposed alternately in a row direction, the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to a corresponding one of the plurality of the signal storages in a second oblique direction that is different from the first oblique direction, and the plurality of openings that are provided in one-to-one correspondence with the plurality of first pixels and the plurality of second pixels have a shape that blocks more incident light, which is oblique light, in a read-out path as the plurality of openings are located toward a direction opposite to an output direction of the signal charges from the pixel array.

Also, a configuration is possible in which the pixel array has a configuration in which the plurality of light receivers and a plurality of the signal storages into which the signal charges of the plurality of light receivers are read out are disposed alternately in a row direction, the pixel array includes a plurality of third pixels and a plurality of fourth pixels, each of the plurality of third pixels being configured such that one of the signal charges is read out from a corresponding one of the plurality of light receivers to a corresponding one of the plurality of the signal storages in a third oblique direction, and each of the plurality of fourth pixels being configured such that another one of the signal charges is read out from a corresponding one of the plurality of light receivers to a corresponding one of the plurality of the signal storages in a fourth oblique direction that is different from the third oblique direction, and the plurality of openings that are provided in one-to-one correspondence with the plurality of third pixels and the plurality of fourth pixels have a shape that blocks more incident light, which is oblique light, in a read-out path as the plurality of openings are located toward a forward direction of an output direction of the signal charges from the pixel array.

Also, a configuration is possible in which the pixel array has a configuration in which the plurality of light receivers and a plurality of the signal storages into which the signal charges of the plurality of light receivers are read out are disposed alternately in a row direction, the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to a corresponding one of the plurality of the signal storages in a second oblique direction that is different from the first oblique direction, and some of the plurality of openings that are provided in one-to-one correspondence with the plurality of first pixels and the plurality of second pixels that are arranged in a same row direction have a shape that equally blocks incident light, which is oblique light, in a read-out path.

Also, a configuration is possible in which the pixel array has a configuration in which the plurality of light receivers and a plurality of the signal storages into which the signal charges of the plurality of light receivers are read out are disposed alternately in a row direction, the pixel array includes a plurality of third pixels and a plurality of fourth pixels, each of the plurality of third pixels being configured such that one of the signal charges is read out from a corresponding one of the plurality of light receivers to a corresponding one of the plurality of the signal storages in a third oblique direction, and each of the plurality of fourth pixels being configured such that another one of the signal charges is read out from a corresponding one of the plurality of light receivers to a corresponding one of the plurality of the signal storages in a fourth oblique direction that is different from the third oblique direction, and some of the plurality of openings that are provided in one-to-one correspondence with the plurality of third pixels and the plurality of fourth pixels that are arranged in a same row direction have a shape that equally blocks incident light, which is oblique light, in a read-out path.

Also, a configuration is possible in which the pixel array has a configuration in which the plurality of light receivers and a plurality of the signal storages into which the signal charges of the plurality of light receivers are read out are disposed alternately in a row direction, the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to the corresponding one of the plurality of the signal storages into which the signal charge of the first pixel is read in a second oblique direction that is different from the first oblique direction, the pixel array further includes: a plurality of third pixels and a plurality of fourth pixels, each of the plurality of third pixels being configured such that one of the signal charges is read out from a corresponding one of the plurality of light receivers to a corresponding one of the plurality of the signal storages in a third oblique direction, and each of the plurality of fourth pixels being configured such that another one of the signal charges is read out from a corresponding one of the plurality of light receivers to the corresponding one of the plurality of the signal storages into which the signal charge of the third pixel is read in a fourth oblique direction that is different from the third oblique direction, some of the plurality of openings that are provided in one-to-one correspondence with the plurality of first pixels and the plurality of second pixels have a shape that blocks more incident light, which is oblique light, in a read-out path as some of the plurality of openings are located toward a direction opposite to an output direction of the signal charges from the pixel array, some of the plurality of openings that are provided in one-to-one correspondence with the plurality of third pixels and the plurality of fourth pixels have a shape that blocks more incident light, which is oblique light, in a read-out path as some of the plurality of openings are located toward a forward direction of the output direction of the signal charges from the pixel array, some of the plurality of openings that are provided in one-to-one correspondence with the plurality of first pixels and the plurality of second pixels that are arranged in a same row direction have a shape that equally blocks incident light, which is oblique light, in a read-out path, and some of the plurality of openings that are provided in one-to-one correspondence with the plurality of third pixels and the plurality of fourth pixels that are arranged in a same row direction have a shape that equally blocks incident light, which is oblique light, in a read-out path.

Also, the imaging apparatus may measure a distance to the subject by using a Time Of Flight (TOF) principle in which near infrared light is emitted to the subject to image light reflected by the subject, and the distance is calculated based on a result obtained.

Also, a solid-state imaging device according to one aspect of the present disclosure is a solid-state imaging device that is used in an imaging apparatus, the imaging apparatus including: an infrared light source that emits infrared light to a subject; and a solid-state imaging device, the solid-state imaging device including: a pixel array in which a plurality of pixels are arranged in rows and columns; a plurality of light receivers that convert incident light from the subject to signal charges, and are arranged in rows and columns correspondingly to the plurality of pixels; a signal storage that stores the signal charges; a signal drain into which the signal charges are discharged; a plurality of microlenses that are disposed on the plurality of light receivers in one-to-one correspondence with the plurality of light receivers; and a plurality of openings that are provided in one-to-one correspondence with the plurality of light receivers, and through which the incident light enters the plurality of light receivers. The solid-state imaging device reads and discharges the signal charges in response to a signal drain voltage being switched between on and off, each of the plurality of microlenses is disposed such that a center of the microlens is displaced toward a center of the pixel array from a center of one of the plurality of light receivers that corresponds to the microlens, as a position of the microlens is closer to a perimeter of the pixel array, and the plurality of openings have different shapes according to positions of the plurality of openings in the pixel array.

With the imaging apparatus and the solid-state imaging device according to the present disclosure, leakage of unwanted signal charges into the pixel array can be suppressed, and the accuracy of distance measurement can be improved.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 5A is a diagram illustrating a structure of an ordinary solid-state imaging device in plan view;

FIG. 5B is a diagram illustrating the structure of the ordinary solid-state imaging device in cross section taken along the line A-A' shown in FIG. 5A;

FIG. 6 is a diagram showing a potential in the C1-C1' direction in FIG. 5B;

FIG. 8 is a diagram showing a potential in the C2-C2' direction in FIG. 7B;

FIG. 9A is a diagram illustrating a structure of a solid-state imaging device according to Embodiment 2 in plan view;

DETAILED DESCRIPTION OF THE EMBODIMENTS

Hereinafter, embodiments according to the present disclosure will be described in detail with reference to the drawings. The embodiments described below show specific examples of the present disclosure. The numerical values, shapes, materials, structural elements, the arrangement and connection of the structural elements, the timing of driving, and the like shown in the following embodiments are merely examples, and therefore are not intended to limit the scope of the present disclosure. Also, among the structural elements described in the following embodiments, structural elements not recited in any one of the independent claims are described as arbitrary structural elements. In addition, the diagrams are schematic representations, and thus are not necessarily true to scale. Also, redundant descriptions of structural elements that are substantially the same will be omitted or simplified.

Embodiment 1

Figure 1:
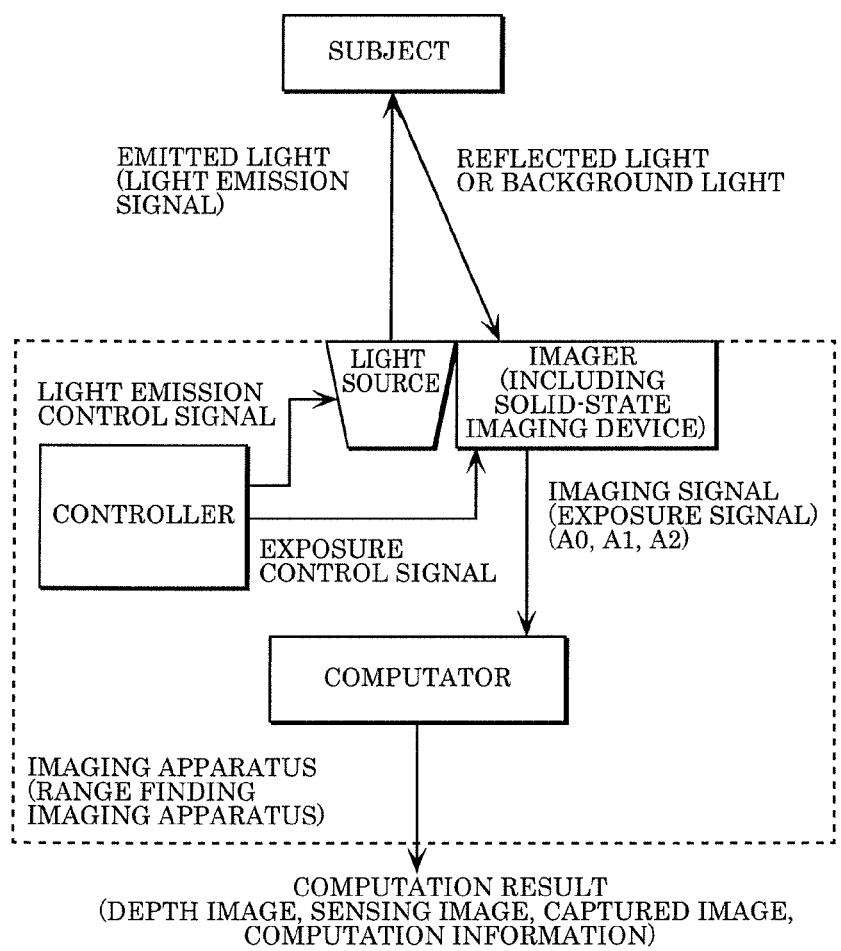
FIG. 1 is a functional block diagram showing an example of a schematic configuration of an imaging apparatus (range finding imaging apparatus) according to Embodiment 1.

FIG. 1 is a functional block diagram showing an example of a schematic configuration of an imaging apparatus (range finding imaging apparatus) according to Embodiment 1.

In recent years, imaging apparatuses (range finding apparatuses or range finding imaging apparatuses) are actively used for applications such as user interfaces for gesture input in game consoles or the like, or accurately measuring the distance to an object in the surroundings for automatic drive control of automobiles or robots.

There are, for example, three types of imaging apparatuses (range finding apparatuses or range finding imaging apparatuses): (1) a stereo type imaging apparatus that uses two cameras; (2) a pattern emission (structured light) type imaging apparatus that emits a specific pattern of near infrared light and calculates distance from changes in the shape of the pattern; and (3) a TOF type imaging apparatus that emits near infrared light, images reflected light, and calculates distance from the result obtained. In the description given below, a TOF type imaging apparatus is used as an example.

As shown in FIG. 1, an imaging apparatus according to the present embodiment includes: a controller that outputs a light emission control signal and an exposure control signal; a light source that emits light at the timing of the light emission control signal; an imager that performs exposure using reflected light that is the light emitted from the light source and reflected by an object (subject) at a plurality of different timings in response to the exposure control signal, and outputs a plurality of imaging signals (exposure signals); and a computator (TOF computator) that performs distance computation upon input of the exposure signal. The imager includes a solid-state imaging device and the like.

Figure 2:
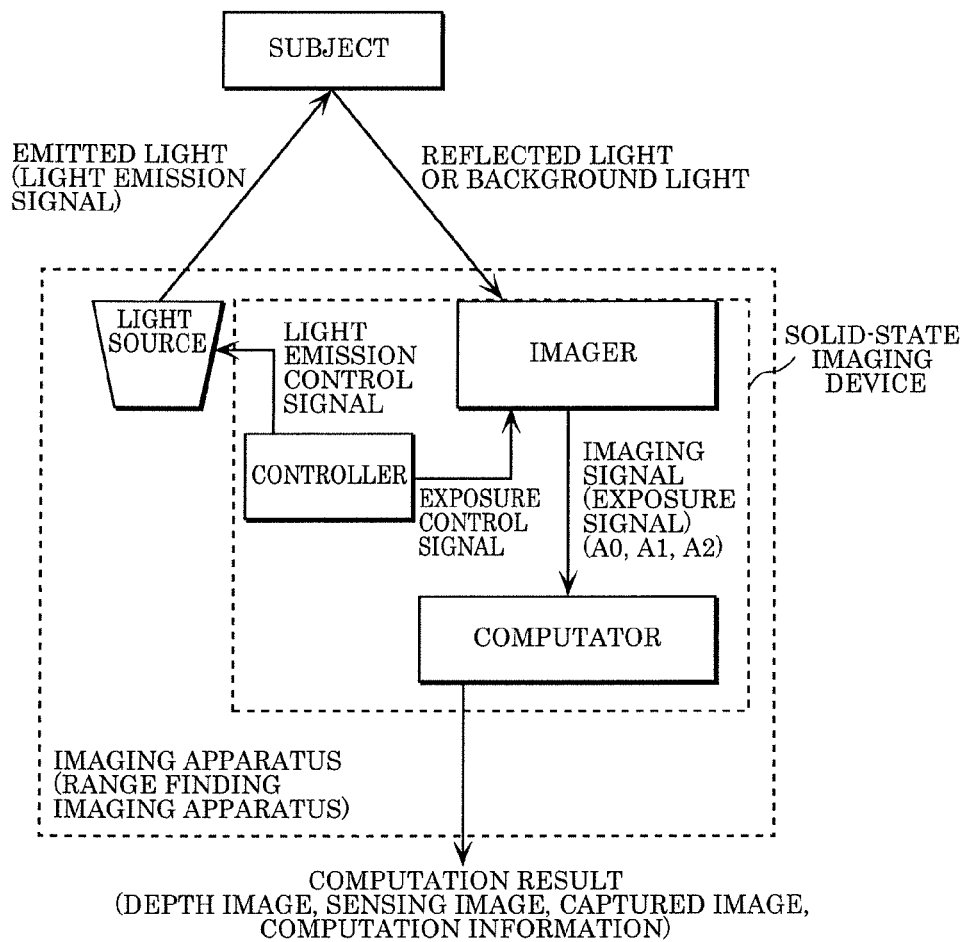
FIG. 2 is a functional block diagram showing another example of the schematic configuration of the imaging apparatus (range finding imaging apparatus) according to Embodiment 1.

FIG. 2 is a functional block diagram showing another example of the schematic configuration of the imaging apparatus (range finding imaging apparatus) according to the embodiment, and is, for example, a configuration example of an image sensor (for example, a CMOS image sensor) in which a controller circuit and a computator circuit are mounted on-chip.

Figure 3A:
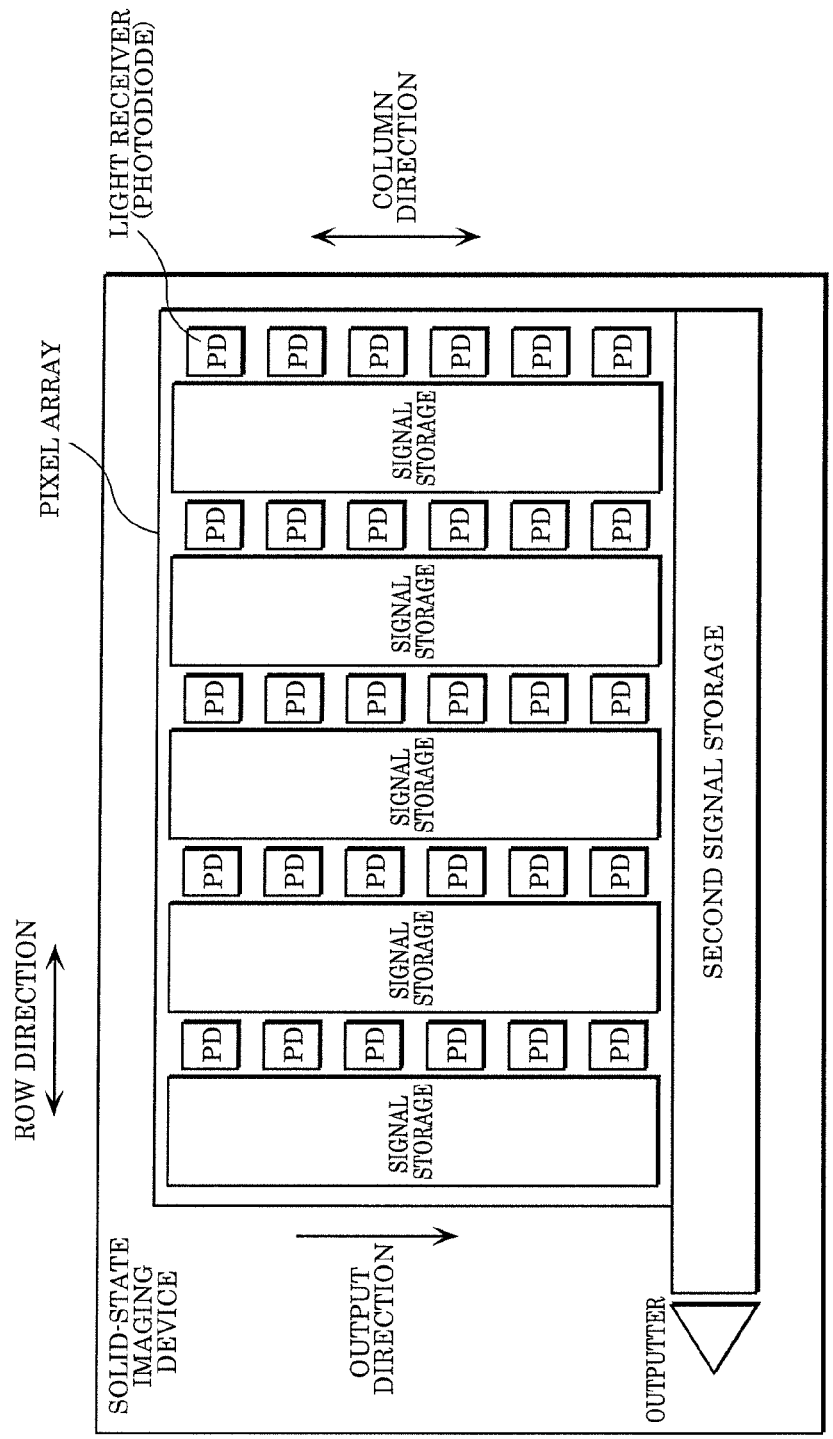
FIG. 3A is a diagram showing a solid-state imaging device according to Embodiment 1.

FIG. 3A is a diagram showing a solid-state imaging device according to the present embodiment. As shown in the diagram, the solid-state imaging device includes light receivers (for example, photodiodes, PDs, or photoelectric converters), signal storages (for example, vertical transfer units), a second signal storage (for example, a horizontal transfer unit), an outputter, and the like. The plurality of light receivers are arranged in an array and a pixel array is thereby formed. The signal storages are disposed adjacent to the light receivers, and store and transfer the signal charges read out from the light receivers.

Although not shown in FIG. 3A, a light collector (for example, a microlens) is disposed for each light receiver. With this configuration, light that is incident on the camera can be efficiently transmitted to the light receivers. A detailed description of the microlens will be given later.

Figure 3B:
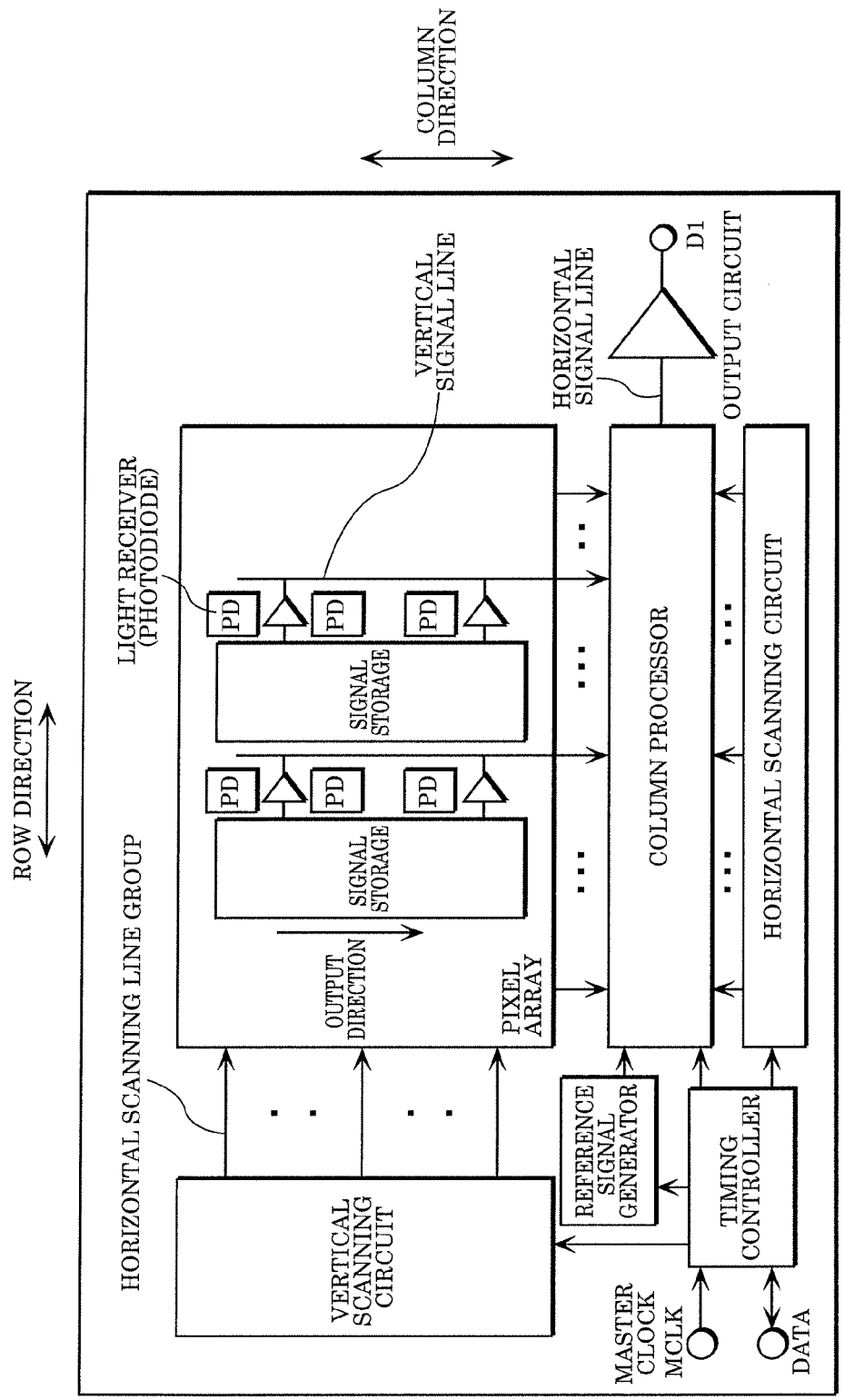
FIG. 3B is a diagram showing another solid-state imaging device according to Embodiment 1.

FIG. 3B is a diagram showing another solid-state imaging device according to the embodiment. As shown in the diagram, the solid-state imaging device includes a timing controller, a reference signal generator, a pixel array that includes light receivers, signal storages, and the like, a vertical scanning circuit, a column processor, a horizontal scanning circuit, and an output circuit.

Also, as in FIG. 3A, the signal storages are disposed adjacent to the light receivers, and store and transfer the signal charges read out from the light receivers. Also, although not shown in FIG. 3B, a microlens (light collector) is disposed for each light receiver as in FIG. 3A.

Figure 4:
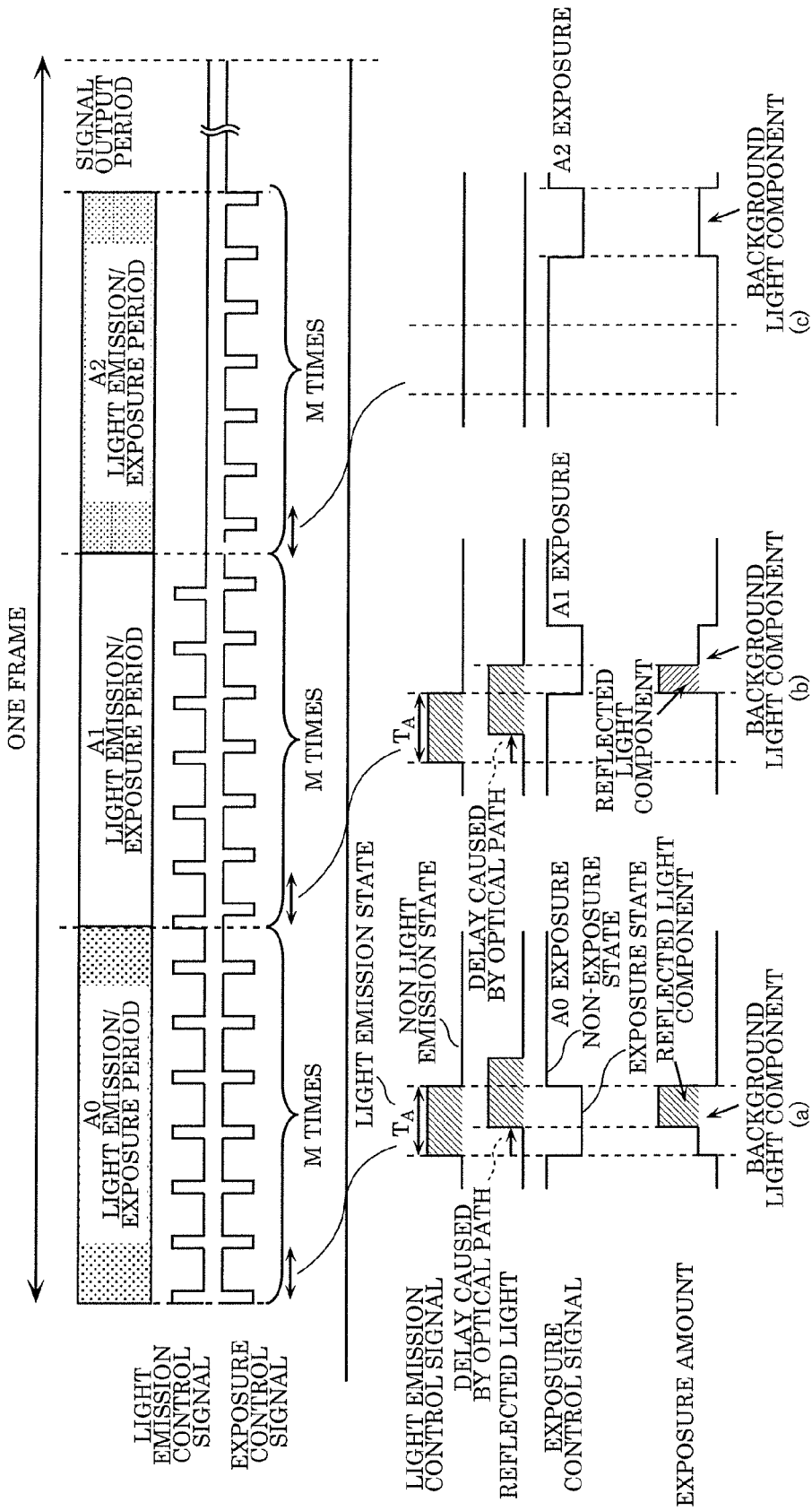
FIG. 4 is a diagram showing a sequence of signal processing performed by the imaging apparatus according to Embodiment 1.

FIG. 4 is a diagram showing a sequence of signal processing performed by the imaging apparatus according to the present embodiment. The present embodiment shows an example in which distance computation such as Z=(A1−A2)/(A0+A1−2A2) is performed using the TOF principle.

The infrared light emitted from the imaging apparatus is, while including a delay caused by the optical path, reflected by a distant subject, and the reflected light arrives at the solid-state imaging device. By performing control of light emission and exposure on the reflected light at different timings, a plurality of types of signals (three different types of signals (A0, A1, and A2)) are obtained within one frame.

Each of signals A0 and A1 includes a reflected light component and a background light component. Signal A2 includes only a background light component. By using the three different signals, a reflected light component, in which a background light component has been removed, can be extracted, and distance computation can be performed.

In general, light emission width $T_A$ of pulsed near infrared light is in the order of about several tens of nanoseconds. Also, because the amount of signal obtained for each time light emission is performed is small, after the control of light emission and exposure is performed M times (M≥1), exposure is sequentially performed using different signals. After all signals are acquired, the signals are sequentially output during a signal output period.

In order to facilitate the understanding of the present embodiment, a description of an ordinary solid-state imaging device will be given here.

FIG. 5A is a plan view of an ordinary solid-state imaging device, in particular, showing the arrangement of microlenses. Also, FIG. 5B shows a structure of the ordinary solid-state imaging device in cross section taken along the line A-A' shown in FIG. 5A.

As shown in FIGS. 5A and 5B, in the ordinary solid-state imaging device, light can be efficiently incident on the center of the light receivers of the center pixels in the pixel array. However, in the pixels located in the perimeter of the pixel array (the pixels located at the left and right ends in the diagrams), light may impinge on the metal wiring layer, light shielding film, or the like, and thus may not be efficiently incident on the light receives, causing a drop in the amount of light.

In order to solve this problem, a method is generally proposed in which the microlenses of the peripheral pixels are displaced (shrunk).

However, the following problems arise when microlenses are simply displaced. The reason will be described with reference to (a) to (0 in FIG. 6 that shows a potential in the C1-C1' direction in FIG. 5B. In FIG. 6, (a) to (f) are used in both the description of the solid-state imaging device of the present embodiment and in the description of the ordinary solid-state imaging device.

First, a signal charge read-out operation performed by the ordinary solid-state imaging device will be described. As shown in (a) in FIG. 6, signal charges (electric charges, signals) are first generated in a light receiver. Next, a read-out voltage is applied to an electrode (gate) provided on a signal storage, and thereby the signal charges are read into the signal storage as shown in (b) in FIG. 6. In the case of discharging unwanted signal charges, as shown in (c) in FIG. 6, a high voltage is applied to the substrate voltage, and the signal charges accumulated in the light receiver are thereby discharged to a substrate via a signal drain (for example, a vertical overflow drain).

On the other hand, because very high-speed exposure control in the order of about several tens of nanoseconds is performed, in the case where reading and discharging of signal charges are controlled according to the state (on or off) of a signal drain voltage (exposure control voltage, control voltage, reset voltage, for example, substrate voltage (φSub)) of the exposure control signal, even in a non-exposure state shown in (d) in FIG. 6, there may be a case where some of the signals are read into the signal storage. However, to address this problem, as shown in (e) in FIG. 6, by setting the saddle point of the potential gradient to a position close to the signal storage, unwanted signal charges generated in the light receiver are easily discharged toward the substrate along the potential gradient, and it is therefore possible to prevent the unwanted signal charges from flowing into the signal storage.

However, there may be a case where, as shown in (f) in FIG. 6, light at an angle (oblique incident light) enters through an interstice of the light shielding film or the like, and reaches a region between the light receiver and the signal storage, where the light undergoes photoelectric conversion and reaches the signal storage.

Particularly in the case of (f) in FIG. 6, when oblique incident light reaches a region between the light receiver and the signal storage, the signal (aliasing signal or noise signal) that undergoes photoelectric conversion easily reaches the signal storage because the distance between the light receiver and the signal storage is short, the saddle point of the potential gradient is also set to a position close to the signal storage so that the potential gradient on the signal storage side is steeply inclined (angle A<angle B in (f) in FIG. 6), and also the read-out voltage is applied (on) (the voltage of the signal storage electrode (gate) is on in (f) in FIG. 6).

The problem as described above that unintended signal charges are mixed with the signal charges stored in the signal storage, resulting in a large distance measurement error cannot be solved by simply displacing the microlenses.

On the other hand, in the present embodiment, the occurrence of aliasing signal (noise signal) described above can be prevented while performing very high-speed exposure control in the order of about several tens of nanoseconds in the driving operations shown in FIG. 4. Details thereof will be described with reference to the drawings.

Figure 7A:
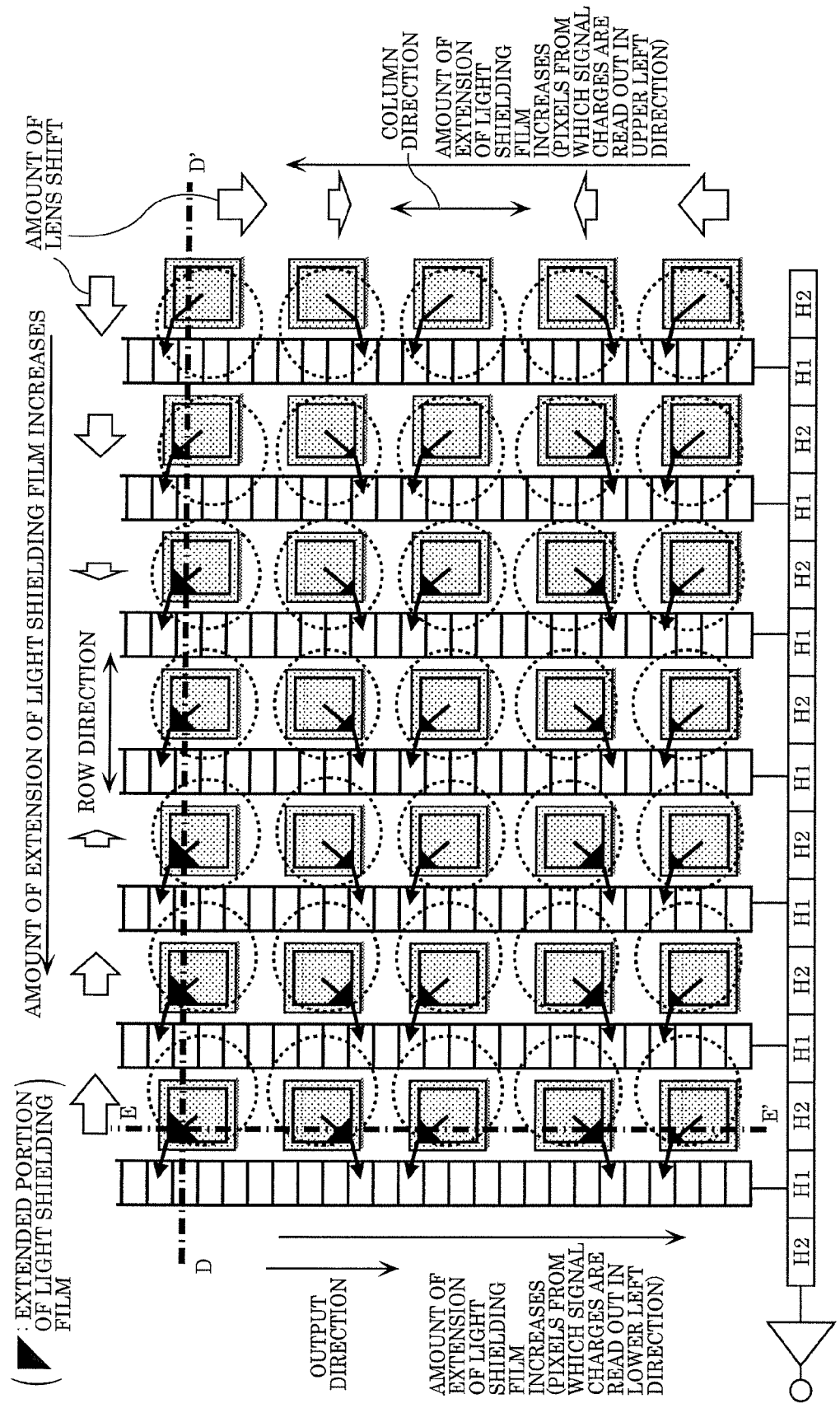
FIG. 7A is a diagram illustrating a structure of a solid-state imaging device according to Embodiment 1 in plan view.

FIG. 7A is a diagram illustrating a structure of the solid-state imaging device of the present embodiment in plan view. More specifically, the solid-state imaging device has a pixel configuration in which a signal charge of a light receiver is read into a signal storage disposed on the left side of the light receiver. In order to facilitate the understanding of the present disclosure, the pixel area (pixel array) in which a plurality of pixels are arranged is expressed using five pixels in the vertical direction and seven pixels in the horizontal direction.

As shown in FIG. 7A, light (incident light) that has entered an optical lens (not shown) passes through a microlens (light collector) provided in a pixel, and is collected to a light receiver. The incident light undergoes photoelectric conversion in the light receiver, and stored in a signal storage (for example, vertical transfer unit) via a read-out path. Signal charges stored in the signal storages are sequentially transferred and stored in a second signal storage (for example, horizontal transfer unit), and signals are finally output via an output amplifier.

Also, the microlenses are formed so as to most efficiently collect light and cause the collected light to reach the light receivers. In order to prevent incident light from intruding into the signal storages and causing a smear or the like, a light shielding film made of tungsten or the like is disposed on the signal storages and the like. Openings are provided above the light receivers (or in other words, openings are formed in the light shielding film), and light enters through the openings.

Figure 7B:
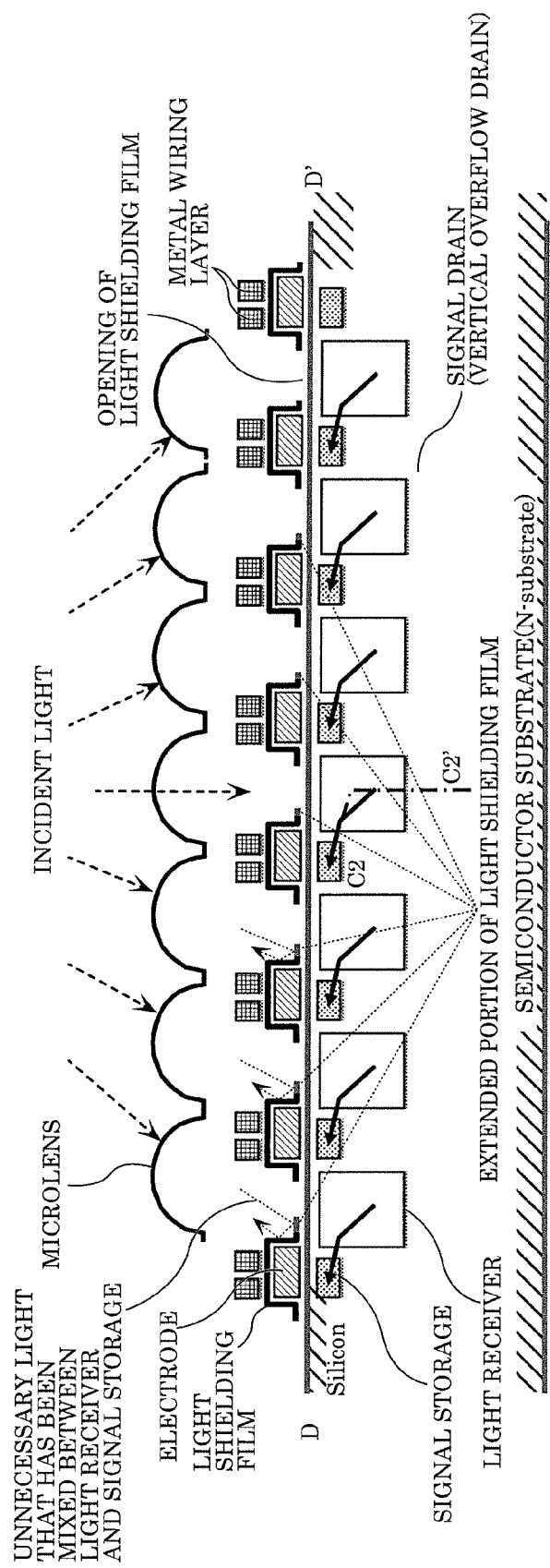
FIG. 7B is a diagram illustrating the structure of the solid-state imaging device according to Embodiment 1 in cross section taken along the line D-D' shown in FIG. 7A.

Also, FIG. 7B shows the structure of the solid-state imaging device of the present embodiment in cross section taken along the line D-D' shown in FIG. 7A. As shown in FIG. 7B, light receivers and signal storages are disposed in pairs, and an electrode (for example, polysilicon) is disposed on each signal storage or the like so as to control read-out, storage and transfer of signals.

Also, a metal film (metal wiring) made of aluminum, tungsten, or the like is disposed in a portion other than the light receivers. As the material for forming the metal film, tungsten is also actively used as the light shielding film for signal storages, or the like, and openings are provided above the light receivers so that light enters the light receivers.

Also, microlenses are disposed above the light receivers so as to cause incident light to efficiently enter the light receivers.

Also, by applying a signal drain voltage (on and off), the signal charges accumulated in the light receivers are read out (and stored in) the signal storages, and unwanted signal charges accumulated in the light receivers are discharged to a signal drain (for example, vertical overflow drain) (for example, discharged to a substrate via the vertical overflow drain).

Furthermore, as shown in FIGS. 7A and 7B, in a pixel in the leftmost column of the pixel array, oblique incident light is most likely to reach the left side (read-out path side) of the light receiver, and is most unlikely to reach the right side (the side opposite to the read-out path) of the light receiver.

On the other hand, in a pixel in the right most column of the pixel array, oblique incident light is most likely to reach the right side (the side opposite to the read-out path) of the light receiver, and is most unlikely to reach the left side (read-out path side) of the light receiver.

To address this problem, in the present embodiment, each center pixel in the pixel array is configured such that the center of the microlens and the center of the light receiver match with each other, and each pixel in the perimeter of the pixel array is configured such that the center of the microlens is displaced toward the center of the pixel array from the center of the light receiver as the position of the pixel is closer to the perimeter of the pixel array.

To be specific, the microlens of a pixel provided on the left side of a center pixel in the pixel array is disposed such that the center of the microlens is displaced toward the right side from the center of the corresponding light receiver. Conversely, the microlens of a pixel provided on the right side of the center pixel in the pixel array is disposed such that the center of the microlens is displaced toward the left side from the center of the corresponding light receiver.

Likewise, the microlens of a pixel provided on the upper side of the center pixel in the pixel array is disposed such that the center of the microlens is displaced toward the lower side from the center of the corresponding light receiver. Conversely, the microlens of a pixel provided on the lower side of the center pixel in the pixel array is disposed such that the center of the microlens is displaced toward the upper side from the center of the corresponding light receiver.

In other words, each of the microlenses is disposed such that the center of the microlens is displaced toward the center of the pixel array from the center of the light receiver that corresponds to the microlens, as the position of the microlens is closer to the perimeter of the pixel array.

Furthermore, in the present embodiment, on the left side of a light receiver that is the read-out path side, the light shielding film is extended to be present above the light receiver (the shape of the opening is changed so as to block light). With this configuration, it is possible to prevent unwanted light from mixing.

To be specific, in the pixels that are arranged in rows and columns, the amount of extension of the light shielding film on the light receiver is increased for the pixel located more left in the pixel array (read-out path side) (or in other words, the amount of extension of the light shielding film on the light receiver is reduced for the pixel located more right (the side opposite to the read-out path)).

In other words, the pixel array has a configuration in which light receivers and signal storages into which signal charges of the light receivers are read out are disposed alternately in a row direction or a column direction, and the opening for each pixel has a shape that blocks more incident light (oblique light) in the read-out path as the pixel is located toward a direction in which the signal charge is read out from the pixel to the signal storage (the left direction or read-out direction).

With this configuration, the amount of light entering the pixel is reduced, and thus decreased sensitivity can be suppressed.

Also, as shown in FIGS. 7A and 7B, in the case of a pixel configuration in which the signal charges of light receivers are read out from the light receivers in an oblique direction, when the pixels are viewed in the longitudinal direction as in the E-E' direction shown in FIG. 7A, there are two types of pixels: first pixels from which signal charges are read out in a substantially upper direction (or in other words, in the upper left direction (a first oblique direction) in FIG. 7A); and second pixels from which signal charges are read out in a substantially lower direction (or in other words, in the lower left direction (a second oblique direction) in FIG. 7A). That is, there are two types of pixels that are located in the same right-left direction, but that have different read-out directions: an upper oblique read-out direction; and a lower oblique read-out direction.

In this case, considering light at an angle (oblique incident light), the same tendency as seen in the case of the structure of the cross section taken along the line D-D' described above can be seen. That is, in an upper pixel in the pixel array, oblique incident light is most likely to reach the upper side of the light receiver, and is most unlikely to reach the lower side of the light receiver. On the other hand, in a lower pixel in the pixel array, oblique incident light is most likely to reach the lower side of the light receiver, and is most unlikely to reach the upper side of the light receiver.

Accordingly, in the pixel array, the pixels from which signal charges are read out in the upper left direction (first oblique direction) in FIG. 7A are configured such that the amount of extension of the light shielding film on the light receiver is increased (the opening for each pixel is shaped so as to block more incident light (oblique light) in the read-out path) as the pixels are located on the more upper side in the pixel array (or in other words, as the pixels are located farther away from the second signal storage (toward the direction opposite to the output direction) in FIG. 7A). In other words, the pixels located on the more lower side in the pixel array (or in other words, the pixels located closer to the second signal storage (toward the forward direction of the output direction) in FIG. 7A) are configured such that the amount of extension of the light shielding film on the light receiver is reduced (the opening for each pixel is shaped so as to block less incident light (oblique light) in the read-out path).

Furthermore, in the pixel array, the pixels from which signal charges are read out in the lower left direction (the second oblique direction that is different from the first oblique direction) in FIG. 7A are configured such that the amount of extension of the light shielding film on the light receiver is reduced (the opening for each pixel is shaped so as to block less incident light (oblique light) in the read-out path) as the pixels are located on the more upper side in the pixel array (or in other words, as the pixels are located farther away from the second signal storage (toward the direction opposite to the output direction) in FIG. 7A). In other words, the pixels located on the more lower side (or in other words, the pixels located closer to the second signal storage (toward the forward direction of the output direction) in FIG. 7A) are configured such that the amount of extension of the light shielding film on the light receiver is increased (the opening for each pixel is shaped so as to block more incident light (oblique light) in the read-out path).

In other words, the pixel array has a configuration in which light receivers and signal storages into which signal charges of the light receivers are read out are disposed alternately in a row direction, and the pixel array includes a plurality of first pixels and a plurality of second pixels, each of the plurality of first pixels being configured such that one of the signal charges is read out from one of the light receivers to one of the signal storages in a first oblique direction, and each of the plurality of second pixels being configured such that another one of the signal charges is read out from another one of the light receivers to another one of the signal storages in a second oblique direction that is different from the first oblique direction. Here, the openings that are provided in one-to-one correspondence with the plurality of first pixels have a shape that blocks more incident light (oblique light) in the read-out path as the openings are located toward a direction opposite to an output direction of the signal charges from the pixel array, and the openings that are provided in one-to-one correspondence with the plurality of second pixels have a shape that blocks more incident light (oblique light) in a read-out path as the openings are located toward a forward direction of the output direction.

With this configuration, the amount of oblique incident light component that is incident on a pixel is increased as the pixel is located toward the periphery of the pixel array, leakage of unwanted signal charges into the signal storage can be suppressed, and distance measurement errors can be reduced.

Also, decreased sensitivity can be suppressed as much as possibly by simply changing the openings of the light shielding film that correspond to necessary pixels in a necessary region, and it is thereby possible to prevent an increase in the power consumption of the entire camera system caused by an increase in the amount of infrared light emitted.

Next, FIG. 8 is a diagram showing a potential in the C2-C2' direction in FIG. 7B.

In the present embodiment, in the driving operations shown in FIG. 4, very high-speed exposure control in the order of about several tens of nanoseconds is performed, and thus reading and discharging of signal charges are controlled by the state (on or off) of the signal drain voltage in response to the exposure control signal. The exposure state shown in FIG. 4 corresponds to (a) in FIG. 8, and the non-exposure state shown in FIG. 4 corresponds to (b) in FIG. 8.

Here, even in the non-exposure state shown in (b) in FIG. 8, there may be a case where some of the signals are read into the signal storage ((c) in FIG. 8). However, in (b) in FIG. 8, the saddle point of the potential gradient is set to a position closer to the signal storage, as compared with that of the potential gradient of the ordinary solid-state imaging device ((c) in FIG. 8).

That is, when the signal drain voltage that corresponds to the non-exposure state is on, the potential gradient has a configuration in which the signal charges are easily discharged toward the signal drain. It is thereby possible to prevent unwanted signal charges from flowing into the signal storage.

The description has been given using the solid-state imaging device shown in FIG. 3A, but the present embodiment can provide the same effect even when an image sensor as shown in FIG. 3B is used.

Also, in the present embodiment, control between the exposure state and the non-exposure state is performed using the substrate voltage (φSub) as the signal drain voltage, and a vertical overflow drain is used as the electric charge drain structure. However, control between the exposure state and the non-exposure state may be performed using the signal drain voltage, and a lateral overflow drain may be used as the electric charge drain structure.

Embodiment 2

An imaging apparatus according to Embodiment 2 of the present disclosure and a solid-state imaging device used therein will be described with reference to the drawings by focusing on differences from the embodiment given above.

Figure 9B:
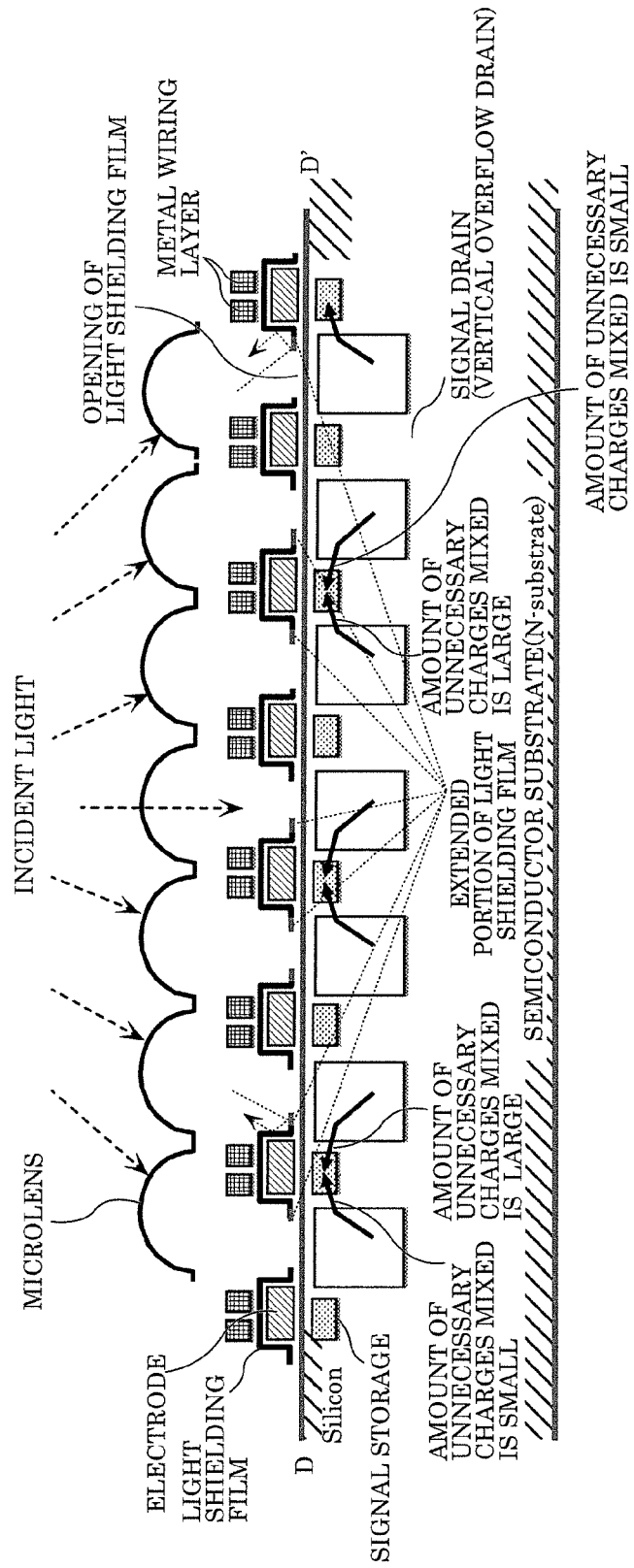
FIG. 9B is a diagram illustrating the structure of the solid-state imaging device according to Embodiment 2 in cross section taken along the line F-F' shown in FIG. 9A.

FIG. 9A is a diagram illustrating a structure of a solid-state imaging device according to Embodiment 2 in plan view. FIG. 9B shows the structure of the solid-state imaging device according to Embodiment 2 in cross section taken along the line F-F' shown in FIG. 9A.

As shown in FIGS. 9A and 9B, pixels configured such that signal charges of two adjacent light receivers are read into one signal storage are disposed in the solid-state imaging device of the present embodiment.

Also, unlike FIG. 7A (Embodiment 1), the solid-state imaging device of the present embodiment includes not only pixels (first pixels) from which signal charges are read out in a direction from the light receivers to the left, but also pixels (second pixels) from which signal charges are read out in a direction from the light receivers to the right.

In this case, the signal charges read out from two adjacent pixels in the row direction are read into the same signal storage. In this configuration, for example, as shown in FIG. 9B, in a region from the center of the pixel array to the left, the amount of unnecessary charges mixed is smaller in the left pixel of two adjacent pixels, and is larger in the right pixel.

On the other hand, in a region from the center of the pixel array to the right, the amount of unnecessary charges mixed is larger in the left pixel of two adjacent pixels, and is smaller in the right pixel.

Accordingly, the amount of unwanted signal charges being mixed in two pixels at the leftmost end of the pixel array and the amount of unwanted signal charges being mixed in two pixels at the rightmost end of the pixel array are substantially the same. Because the amount of unwanted signal charges being mixed is the same in the signal charges at the leftmost end and the signal charges at the rightmost end as viewed in the horizontal direction, the amount of extension of the light shielding film on the light receiver is set to be the same.

In other words, the pixel array includes: a plurality of first pixels that are configured such that signal charges are read out in a first oblique direction (upper left direction, lower left direction, obliquely upward first read-out direction, obliquely downward first read-out direction); a plurality of second pixels that are each provided adjacent to the first pixel in the row direction and configured such that signal charges are read into the same signal storage as the first pixel in a second oblique direction (upper right direction, lower right direction, obliquely upward second read-out direction, obliquely downward second read-out direction); a plurality of third pixels that are configured such that signal charges are read out in a third oblique direction (lower left direction, obliquely left forward direction, obliquely downward first read-out direction, obliquely forward first read-out direction); and a plurality of fourth pixels that are each provided adjacent to the third pixel in the row direction and configured such that signal charges are read into the same signal storage as the third pixel in a fourth oblique direction (lower right direction, obliquely right forward direction, obliquely downward second read-out direction, obliquely forward second read-out direction). The openings of a first pixel and a second pixel that are arranged in the same row direction have a shape that equally blocks incident light (oblique light) in the read-out path, and the openings of a third pixel and a fourth pixel that are arranged in the same row direction have a shape that equally blocks incident light (oblique light) in the read-out path.

However, as in Embodiment 1, when the pixel area is viewed in the longitudinal direction as in the G-G' direction shown in FIG. 9A, there are two types of pixels: pixels from which signal charges are read out in a substantially upper direction of the pixel array; and pixels from which signal charges are read out in a substantially lower direction of the pixel array. Accordingly, the amount of extension of the light shielding film on the light receiver is changed between an upper end pixel in the pixel array and a lower end pixel in the pixel array.

Accordingly, in the pixels from which signal charges are read out in a substantially upper direction of the pixel array (such as, for example, the pixels in the uppermost line in FIG. 9A), the amount of extension of the light shielding film is increased as the pixel position is closer to the upper end (the opening for each pixel is shaped so as to block more incident light (oblique light) in the read-out path as the pixel is located toward a direction opposite to the output direction of signal charges from the pixel array), and the amount of extension of the light shielding film is reduced as the pixel position is closer to the lower end (the opening for each pixel is shaped so as to block less incident light (oblique light) in the read-out path as the pixel is located toward a forward direction of the output direction of signal charges from the pixel array).

Likewise, in the pixels from which signal charges are read out in a substantially lower direction of the pixel array (such as, for example, the pixels in the second uppermost line in FIG. 9A), the amount of extension of the light shielding film is increased as the pixel position is closer to the lower end (the opening for each pixel is shaped so as to block more incident light (oblique light) in the read-out path as the pixel is located toward a forward direction of the output direction of signal charges from the pixel array), and the amount of extension of the light shielding film is reduced as the pixel position is closer to the upper end (the opening for each pixel is shaped so as to block less incident light (oblique light) in the read-out path as the pixel is located toward a direction opposite to the output direction of signal charges from the pixel array).

In other words, the pixel array includes pixels that serve as repeating units, each including a light receiver and a signal storage. The pixel array includes: a plurality of first pixels that are configured such that signal charges are read out in a first oblique direction (upper left direction, lower left direction, obliquely upward first read-out direction, obliquely downward first read-out direction); a plurality of second pixels that are each provided adjacent to the first pixel in the row direction and configured such that signal charges are read into the same signal storage as the first pixel in a second oblique direction (upper right direction, lower right direction, obliquely upward second read-out direction, obliquely downward second read-out direction); a plurality of third pixels that are configured such that signal charges are read out in a third oblique direction (lower left direction, obliquely left forward direction, obliquely downward first read-out direction, obliquely forward first read-out direction); and a plurality of fourth pixels that are each provided adjacent to the third pixel in the row direction and configured such that signal charges are read into the same signal storage as the third pixel in a fourth oblique direction (lower right direction, obliquely right forward direction, obliquely downward second read-out direction, obliquely forward second read-out direction). The openings of the first pixels and the second pixels have a shape that blocks more incident light (oblique light) in the read-out path as the pixels are located toward a direction opposite to the output direction, and the openings of the third pixels and the fourth pixels have a shape that blocks more incident light (oblique light) in the read-out path as the pixels are located toward a forward direction of the output direction.

With the configuration described above, a conventional situation can be suppressed in which the amount of oblique incident light component incident on a pixel increases as the pixel is located toward the perimeter of the pixel array, and a large amount of unwanted signal charges leaks into the signal storage, and thus distance measurement errors can be reduced.

Also, as a result of decreased sensitivity being suppressed as much as possible, it is possible to prevent an increase in the power consumption of the entire camera system caused by an increase in the amount of infrared light emitted.

As in Embodiment 1, the same effect can be obtained even when a CMOS sensor as shown in FIG. 3B is used.

Embodiment 3

An imaging apparatus according to Embodiment 3 of the present disclosure and a solid-state imaging device used therein will be described with reference to the drawings by focusing on differences from the embodiments given above.

Figure 10A:
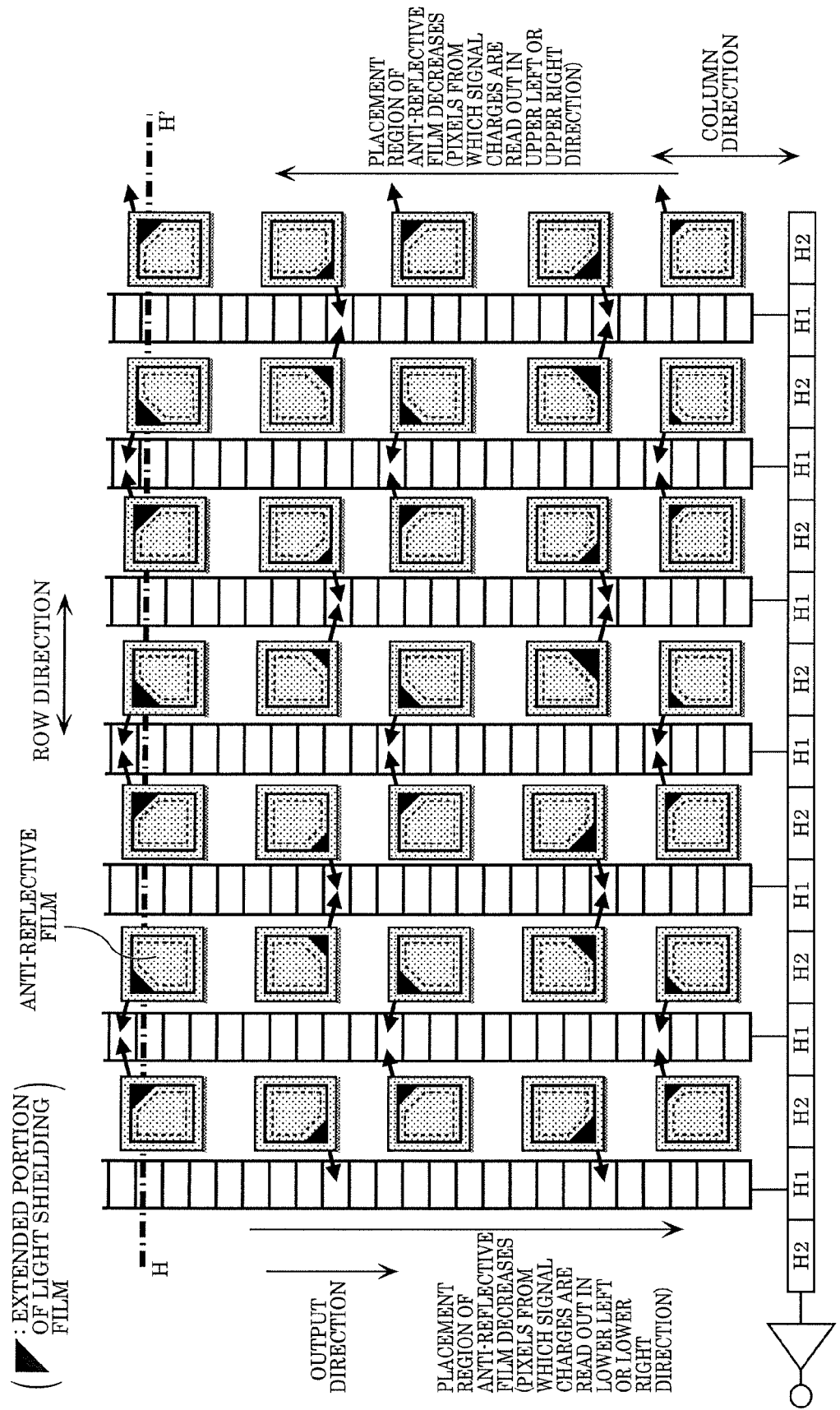
FIG. 10A is a diagram illustrating a structure of a solid-state imaging device according to Embodiment 3 in plan view.
Figure 10B:
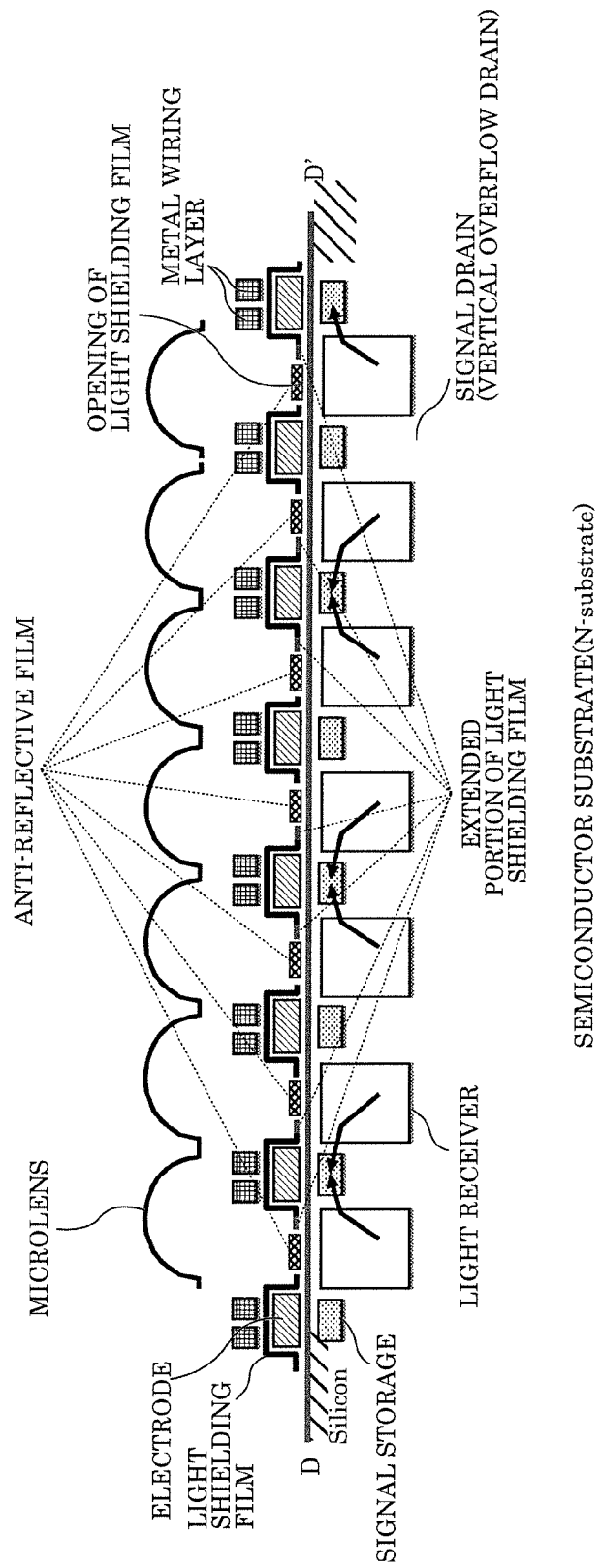
FIG. 10B is a diagram illustrating the structure of the solid-state imaging device according to Embodiment 3 in cross section taken along the line H-H' shown in FIG. 10A.

A solid-state imaging device of Embodiment 3 shown in FIG. 10A is different from the solid-state imaging devices of the embodiments described above in that the size of an anti-reflective film disposed on each light receiver is changed for each pixel or for each pixel region. FIG. 10B shows a structure of the solid-state imaging device of Embodiment 3 in cross section taken along the line H-H' shown in FIG. 10A.

In the present embodiment, the size of an anti-reflective film disposed on each light receiver is not the same. The anti-reflective film disposed on each light receiver is disposed so as to provide a sufficient space relative to any portion along the opening of the light shielding film on the light receiver such that the anti-reflective film does not overlap the light shielding film even if misalignment of a photomask occurs.

The size of the anti-reflective film is changed along with changing the size of the light shielding film for each pixel or for each pixel region.

Figure 11:
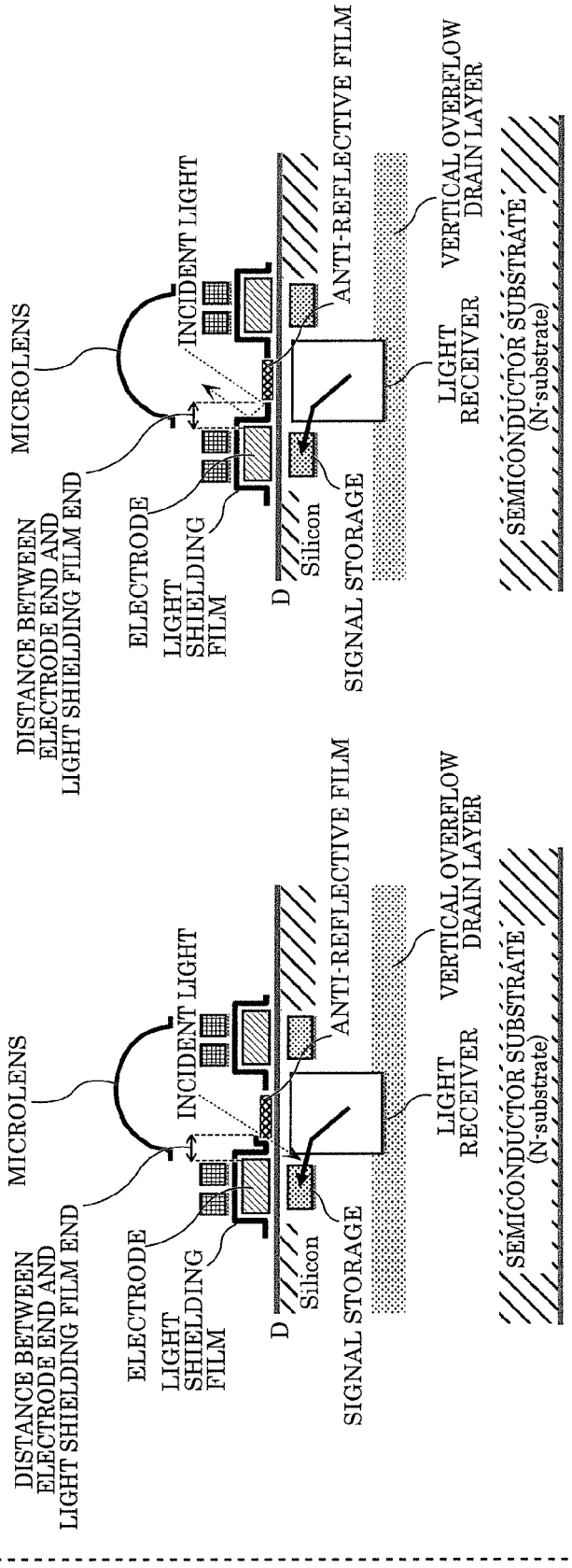
FIG. 11 is a diagram illustrating a structure of the solid-state imaging device according to Embodiment 3 in cross section.

(a) in FIG. 11 is a diagram illustrating a structure in cross-section in the case where the light shielding film is overlaid on the anti-reflective film, and (b) in FIG. 11 is a diagram illustrating a structure in cross-section in the case where the light shielding film is not overlaid on the anti-reflective film. In order to facilitate the understanding of the configuration of the present embodiment, the following description will be given assuming that the distance between the electrode end of the signal storage and the end of the light shielding film is the same in both (a) and (b) in FIG. 11.

(a) in FIG. 11 shows the case where the light shielding film overlaps the anti-reflective film due to the occurrence of misalignment of a photomask during the step of forming the anti-reflective film. In (a) in FIG. 11, the designed distance between the electrode end and the light shielding film end is the same. However, because the light shielding film is overlaid on the anti-reflective film, the light passage space increases accordingly, as compared with the case where the light shielding film is not overlaid on the anti-reflective film, which causes the occurrence of unwanted signal charges.

In order to prevent this, the cause of occurrence of unwanted signal charges can be reduced by changing the size of the anti-reflective film as well when the opening size of the light shielding film is changed for each pixel.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

What is claimed is:

1. An imaging apparatus, comprising: an infrared light source that emits infrared light to a subject; and a solid-state imaging device that includes a pixel array in which a plurality of pixels are arranged in rows and columns, wherein the solid-state imaging device includes: a plurality of light receivers that convert incident light from the subject to signal charges, and are arranged in rows and columns correspondingly to the plurality of pixels; a signal storage that stores the signal charges; a signal drain into which the signal charges are discharged; a plurality of microlenses that are disposed on the plurality of light receivers in one-to-one correspondence with the plurality of light receivers; and a plurality of openings that are provided in one-to-one correspondence with the plurality of light receivers, and through which the incident light enters the plurality of light receivers, each of the plurality of pixels includes one of the plurality of light receivers, one of the plurality of microlenses and one of the plurality of openings, the solid-state imaging device reads and discharges the signal charges in response to a signal drain voltage being switched between on and off, each of the plurality of microlenses is disposed such that a center of the microlens is displaced toward a center of the pixel array from a center of one of the plurality of light receivers that corresponds to the microlens, as a position of the microlens is closer to a perimeter of the pixel array, the plurality of openings have different shapes and areas according to positions of the plurality of pixels in the pixel array, each of the areas of the plurality of openings is defined by an extension of a light shielding film disposed over a corresponding one of the plurality of light receivers, and an amount of the extension of the light shielding film varies according to positions of the plurality of pixels in the pixel array.

2. The imaging apparatus according to claim 1, wherein the signal drain voltage is a substrate voltage, which is represented by φSub, and
the signal drain is a vertical overflow drain.

3. The imaging apparatus according to claim 1, wherein the signal drain is a lateral overflow drain.

4. The imaging apparatus according to claim 1, wherein a read-out voltage is on while the solid-state imaging device reads and discharges the signal charges.

5. The imaging apparatus according to claim 1,
wherein each of the plurality of openings has a shape that blocks incident light, which is oblique light, in a read-out path.

6. The imaging apparatus according to claim 1,
wherein the pixel array has a configuration in which the plurality of light receivers and a plurality of the signal storages into which the signal charges of the plurality of light receivers are read out are disposed alternately in a row direction or a column direction,
the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to a corresponding one of the plurality of the signal storages in a second oblique direction that is different from the first oblique direction,
some of the plurality of openings that are provided in one-to-one correspondence with the plurality of first pixels have a shape that blocks more incident light, which is oblique light, in a read-out path as some of the plurality of openings are located toward a direction opposite to an output direction of the signal charges from the pixel array, and
some of the plurality of openings that are provided in one-to-one correspondence with the plurality of second pixels have a shape that blocks more incident light, which is oblique light, in a read-out path as some of the plurality of openings are located toward a forward direction of the output direction.

7. The imaging apparatus according to claim 1,
wherein the pixel array has a configuration in which the plurality of light receivers and a plurality of the signal storages into which the signal charges of the plurality of light receivers are read out are disposed alternately in a row direction, and
the plurality of openings have a shape that blocks more incident light, which is oblique light, in a read-out path as the plurality of openings are located toward a read-out direction of the signal charges from the plurality of pixels into the plurality of the signal storages.

8. The imaging apparatus according to claim 1,
wherein the pixel array has a configuration in which the plurality of light receivers and a plurality of the signal storages into which the signal charges of the plurality of light receivers are read out are disposed alternately in a row direction,
the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to a corresponding one of the plurality of the signal storages in a second oblique direction that is different from the first oblique direction, and
the plurality of openings that are provided in one-to-one correspondence with the plurality of first pixels and the plurality of second pixels have a shape that blocks more incident light, which is oblique light, in a read-out path as the plurality of openings are located toward a direction opposite to an output direction of the signal charges from the pixel array.

9. The imaging apparatus according to claim 1,
wherein the pixel array has a configuration in which the plurality of light receivers and a plurality of the signal storages into which the signal charges of the plurality of light receivers are read out are disposed alternately in a row direction,
the pixel array includes a plurality of third pixels and a plurality of fourth pixels, each of the plurality of third pixels being configured such that one of the signal charges is read out from a corresponding one of the plurality of light receivers to a corresponding one of the plurality of the signal storages in a third oblique direction, and each of the plurality of fourth pixels being configured such that another one of the signal charges is read out from a corresponding one of the plurality of light receivers to a corresponding one of the plurality of the signal storages in a fourth oblique direction that is different from the third oblique direction, and
the plurality of openings that are provided in one-to-one correspondence with the plurality of third pixels and the plurality of fourth pixels have a shape that blocks more incident light, which is oblique light, in a read-out path as the plurality of openings are located toward a forward direction of an output direction of the signal charges from the pixel array.

10. The imaging apparatus according to claim 1,
wherein the pixel array has a configuration in which the plurality of light receivers and a plurality of the signal storages into which the signal charges of the plurality of light receivers are read out are disposed alternately in a row direction,
the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to a corresponding one of the plurality of the signal storages in a second oblique direction that is different from the first oblique direction, and
some of the plurality of openings that are provided in one-to-one correspondence with the plurality of first pixels and the plurality of second pixels that are arranged in a same row direction have a shape that equally blocks incident light, which is oblique light, in a read-out path.

11. The imaging apparatus according to claim 1,
wherein the pixel array has a configuration in which the plurality of light receivers and a plurality of the signal storages into which the signal charges of the plurality of light receivers are read out are disposed alternately in a row direction,
the pixel array includes a plurality of third pixels and a plurality of fourth pixels, each of the plurality of third pixels being configured such that one of the signal charges is read out from a corresponding one of the plurality of light receivers to a corresponding one of the plurality of the signal storages in a third oblique direction, and each of the plurality of fourth pixels being configured such that another one of the signal charges is read out from a corresponding one of the plurality of light receivers to a corresponding one of the plurality of the signal storages in a fourth oblique direction that is different from the third oblique direction, and some of the plurality of openings that are provided in one-to-one correspondence with the plurality of third pixels and the plurality of fourth pixels that are arranged in a same row direction have a shape that equally blocks incident light, which is oblique light, in a read-out path.

12. The imaging apparatus according to claim 1,
wherein the pixel array has a configuration in which the plurality of light receivers and a plurality of the signal storages into which the signal charges of the plurality of light receivers are read out are disposed alternately in a row direction, the pixel array includes a plurality of first pixels and a plurality of second pixels, each of the plurality of first pixels being configured such that one of the signal charges is read out from a corresponding one of the plurality of light receivers to a corresponding one of the plurality of the signal storages in a first oblique direction, and each of the plurality of second pixels being configured such that another one of the signal charges is read out from a corresponding one of the plurality of light receivers to the corresponding one of the plurality of the signal storages into which the signal charge of the first pixel is read in a second oblique direction that is different from the first oblique direction, the pixel array further includes: a plurality of third pixels and a plurality of fourth pixels, each of the plurality of third pixels being configured such that one of the signal charges is read out from a corresponding one of the plurality of light receivers to a corresponding one of the plurality of the signal storages in a third oblique direction, and each of the plurality of fourth pixels being configured such that another one of the signal charges is read out from a corresponding one of the plurality of light receivers to the corresponding one of the plurality of the signal storages into which the signal charge of the third pixel is read in a fourth oblique direction that is different from the third oblique direction, some of the plurality of openings that are provided in one-to-one correspondence with the plurality of first pixels and the plurality of second pixels have a shape that blocks more incident light, which is oblique light, in a read-out path as some of the plurality of openings are located toward a direction opposite to an output direction of the signal charges from the pixel array, some of the plurality of openings that are provided in one-to-one correspondence with the plurality of third pixels and the plurality of fourth pixels have a shape that blocks more incident light, which is oblique light, in a read-out path as some of the plurality of openings are located toward a forward direction of the output direction of the signal charges from the pixel array, some of the plurality of openings that are provided in one-to-one correspondence with the plurality of first pixels and the plurality of second pixels that are arranged in a same row direction have a shape that equally blocks incident light, which is oblique light, in a read-out path, and some of the plurality of openings that are provided in one-to-one correspondence with the plurality of third pixels and the plurality of fourth pixels that are arranged in a same row direction have a shape that equally blocks incident light, which is oblique light, in a read-out path.

13. The imaging apparatus according to claim 1,
wherein the imaging apparatus measures a distance to the subject by using a Time Of Flight (TOF) principle in which near infrared light is emitted to the subject to image light reflected by the subject, and the distance is calculated based on a result obtained.

14. The imaging apparatus according to claim 1, wherein the amount of the extension of the light shielding film increases as the positions of the plurality of pixels are located on a more upper side in the pixel array so as to block more incident light.

15. The imaging apparatus according to claim 1, wherein:
the amount of the extension of the light shielding film decreases as the positions of the plurality of pixels are located on a more upper side in the pixel array so as to block less incident light.

16. A solid-state imaging device that is used in an imaging apparatus, the imaging apparatus including: an infrared light source that emits infrared light to a subject; and a solid-state imaging device, the solid-state imaging device comprising: a pixel array in which a plurality of pixels are arranged in rows and columns; a plurality of light receivers that convert incident light from the subject to signal charges, and are arranged in rows and columns correspondingly to the plurality of pixels; a signal storage that stores the signal charges; a signal drain into which the signal charges are discharged; a plurality of microlenses that are disposed on the plurality of light receivers in one-to-one correspondence with the plurality of light receivers; and a plurality of openings that are provided in one-to-one correspondence with the plurality of light receivers, and through which the incident light enters the plurality of light receivers, wherein: each of the plurality of pixels includes one of the plurality of light receivers, one of the plurality of microlenses and one of the plurality of openings, the solid-state imaging device reads and discharges the signal charges in response to a signal drain voltage being switched between on and off, each of the plurality of microlenses is disposed such that a center of the microlens is displaced toward a center of the pixel array from a center of one of the plurality of light receivers that corresponds to the microlens, as a position of the microlens is closer to a perimeter of the pixel array, the plurality of openings have different shapes and areas according to positions of the plurality of pixels in the pixel array, each of the areas of the plurality of openings is defined by an extension of a light shielding film disposed over a corresponding one of the plurality of light receivers, and an amount of the extension of the light shielding film varies according to positions of the plurality of pixels in the pixel array.

17. The solid-state imaging device according to claim 16, wherein the amount of the extension of the light shielding film increases as the positions of the plurality of pixels are located on a more upper side in the pixel array so as to block more incident light.

18. The solid-state imaging device according to claim 16, wherein:
the amount of the extension of the light shielding film decreases as the positions of the plurality of pixels are located on a more upper side in the pixel array so as to block less incident light.

* * * * *